(12) United States Patent
Ayala et al.

(10) Patent No.: US 8,592,308 B2
(45) Date of Patent: Nov. 26, 2013

(54) SILICIDED DEVICE WITH SHALLOW IMPURITY REGIONS AT INTERFACE BETWEEN SILICIDE AND STRESSED LINER

(75) Inventors: Javier Ayala, Poughkeepsie, NY (US); Christian Lavoie, Pleasantville, NY (US); Ahmet S. Ozcan, Pleasantville, NY (US)

(73) Assignee: International Business Machines Corporation, Armonk, NY (US)

( * ) Notice: Subject to any disclaimer, the term of this patent is extended or adjusted under 35 U.S.C. 154(b) by 194 days.

(21) Appl. No.: 13/186,587

(22) Filed: Jul. 20, 2011

(65) Prior Publication Data

US 2013/0020616 A1 Jan. 24, 2013

(51) Int. Cl.
*H01L 29/78* (2006.01)

(52) U.S. Cl.
USPC ........... 438/658; 438/210; 438/287; 257/288; 257/E21.158

(58) Field of Classification Search
USPC ........... 257/288, E21.158, E29.255; 438/658, 438/210, 287, 222, 383, 238
See application file for complete search history.

(56) References Cited

U.S. PATENT DOCUMENTS

| | | | |
|---|---|---|---|
| 6,376,372 B1 | 4/2002 | Paranjpe et al. | |
| 6,586,333 B1 | 7/2003 | Woo et al. | |
| 6,803,636 B2 | 10/2004 | Ibara et al. | |
| 6,838,363 B2 | 1/2005 | Wieczorek et al. | |
| 6,890,854 B2 | 5/2005 | Lee et al. | |
| 7,279,758 B1 | 10/2007 | Li et al. | |
| 7,625,801 B2 | 12/2009 | Wu et al. | |
| 7,759,208 B1 | 7/2010 | Frye et al. | |
| 7,790,540 B2* | 9/2010 | Yang et al. | 438/199 |
| 2011/0147815 A1* | 6/2011 | Takeda | 257/288 |

OTHER PUBLICATIONS

Cheng, et al., "Effect of Nitrogen Ion Implanation on the Formation of Nickel Silicide Contacts on Shallow Junctions", Thin Solid Films, vols. 355-356, Nov. 1, 1999, pp. 412-416.
Luo, et al., "Interaction of NiSi with Dopants for Metallic Source/Drain Applications", J. Vac. Sci. Technol. B, vol. 28, Jan./Feb. 2010, Cli1-Cli11; pp. 1-11.

* cited by examiner

*Primary Examiner* — Roy Potter
(74) *Attorney, Agent, or Firm* — Cantor Colburn LLP; Yuanmin Cai

(57) ABSTRACT

A method of forming a semiconductor device includes forming a silicide contact region of a field effect transistor (FET); forming a shallow impurity region in a top surface of the silicide contact region; and forming a stressed liner over the FET such that the shallow impurity region is located at an interface between the silicide contact region and the stressed liner, wherein the shallow impurity region comprises one or more impurities, and is configured to hinder diffusion of silicon within the silicide contact region and prevent morphological degradation of the silicide contact region.

14 Claims, 6 Drawing Sheets

SILICIDED DEVICE WITH SHALLOW IMPURITY REGIONS AT INTERFACE BETWEEN SILICIDE AND STRESSED LINER

BACKGROUND

This disclosure relates generally to the field of complementary metal-oxide-semiconductor (CMOS) device fabrication, and more particularly to formation of a stressed liner over a silicided CMOS device.

Stressed liners, which may include a nitride film deposited over a device, are used to boost performance for CMOS devices such as field effect transistors (FETs). A stressed liner with compressive stress enhances hole mobility in a channel of a p-type FET (PFET), and a stressed liner with a tensile stress enhances electron mobility in a channel of an n-type FET (NFET). The stressed liner may be deposited over the device after contact formation. For devices in which the contacts are silicide, the stressed liner is deposited on the silicide contact regions after formation of the silicide in the contact regions. The stressed liner covers the silicide contacts, usually making direct contact with the silicide contacts.

In order to reach relatively high stress values in a stressed liner so as to increase device performance, a nitride stressed liner is deposited over the FET device at a relatively high temperature (for example, in a range from about 400° C. to about 500° C.). Stressed liner deposition may take several minutes, during which time the FET device is exposed to the relatively high temperature. Further, the stress experienced by the device from the stressed liner may be relatively high. To enhance carrier mobility in a FET channel, a stressed liner having a compressive stress of about 3.5 gigapascals (GPa) may be deposited over a PFET device, or a stressed liner having a tensile stress of about 1 GPa may be deposited over an NFET device. The combination of the relatively high stress and high temperature processing may cause silicide degradation in silicide contact regions in the device, particularly in PFET silicide contacts that are formed in a silicon germanium (SiGe) substrate. The degraded silicide may appear spotty or have voids that can cause contact opens and circuit fails, which reduce device yield for the CMOS fabrication process. Reducing the liner deposition temperature and liner stress may mitigate silicide degradation; however, reduction of liner deposition temperature and liner stress results in a lower-performance FET device.

SUMMARY

In one aspect, a method of forming a semiconductor device includes forming a silicide contact region of a field effect transistor (FET); forming a shallow impurity region in a top surface of the silicide contact region; and forming a stressed liner over the FET such that the shallow impurity region is located at an interface between the silicide contact region and the stressed liner, wherein the shallow impurity region comprises one or more impurities, and is configured to hinder diffusion of silicon within the silicide contact region and prevent morphological degradation of the silicide contact region.

In another aspect, a field effect transistor (FET) includes a gate structure formed over a substrate; a source and drain regions formed in the substrate, adjacent the gate structure; silicide contact regions formed on the gate structure, source and drain regions, the silicide contacts having a shallow impurity region located at a top surface thereof; and a stressed liner formed over the FET, wherein the shallow impurity region is located at an interface between the silicide contact region and the stressed liner, and wherein the shallow impurity region comprises one or more impurities, and is configured to hinder diffusion of silicon within the silicide contact region and prevent morphological degradation of the silicide contact region.

Additional features are realized through the techniques of the present exemplary embodiment. Other embodiments are described in detail herein and are considered a part of what is claimed. For a better understanding of the features of the exemplary embodiment, refer to the description and to the drawings.

BRIEF DESCRIPTION OF THE SEVERAL VIEWS OF THE DRAWINGS

Referring now to the drawings wherein like elements are numbered alike in the several FIGURES.

DETAILED DESCRIPTION

Embodiments of a silicided device with shallow impurity regions at an interface between the silicide and a stressed liner, and a method of forming a silicided device with shallow impurity regions at an interface between the silicide and a stressed liner, are provided, with exemplary embodiments being discussed below in detail. Before formation of a stressed liner over a device having silicide contacts, shallow impurity regions may be formed in a top surface of the silicide contacts. These shallow impurity regions act to protect the silicide during formation of the stressed liner, preventing silicide degradation. The impurities may include one or more of carbon (C), nitrogen (N), or fluorine (F) in some embodiments. Additionally, in some embodiments, the impurities may be one or more of tantalum (Ta), rhenium (Re), molybdenum (Mo), titanium (Ti), niobium (Nb), arsenic (As) or antimony (Sb), and aluminum (Al). The shallow impurity regions may have an impurity concentration of about 1E15 per $cm^2$ or greater. The shallow impurity regions may be formed in the silicide by any of implantation, cluster implant, or plasma treatment. In particular, the C, N, or F impurities at the interface between the silicide and stress liner may hinder diffusion of silicon (Si) within the silicide contact (which may be nickel or nickel platinum in various embodiments) and retard morphological reorganization, thereby preventing silicide degradation during stress liner deposition. The shallow impurity regions can be formed without patterning and do not adversely affect other electrical parameters of the silicided FET device. The shallow impurity region may also hinder diffusion of germanium (Ge) in the silicide contact in embodiments in which the substrate comprises silicon germanium (SiGe).

Figure 1:
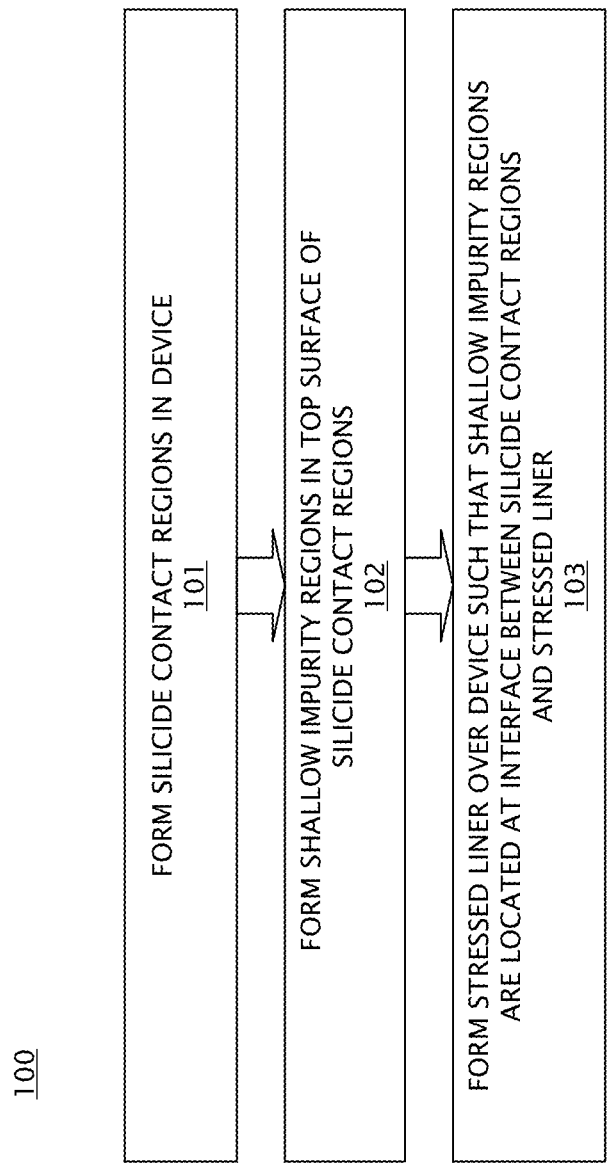
FIG. 1 is a flowchart illustrating an embodiment of a method of forming a silicided device with shallow impurity regions in the silicide and a stressed liner.

Turning to FIG. 1, a flowchart illustrating an embodiment of a method 100 of forming a silicided device with shallow impurity regions in the silicide and a stressed liner is shown.

Figure 2:
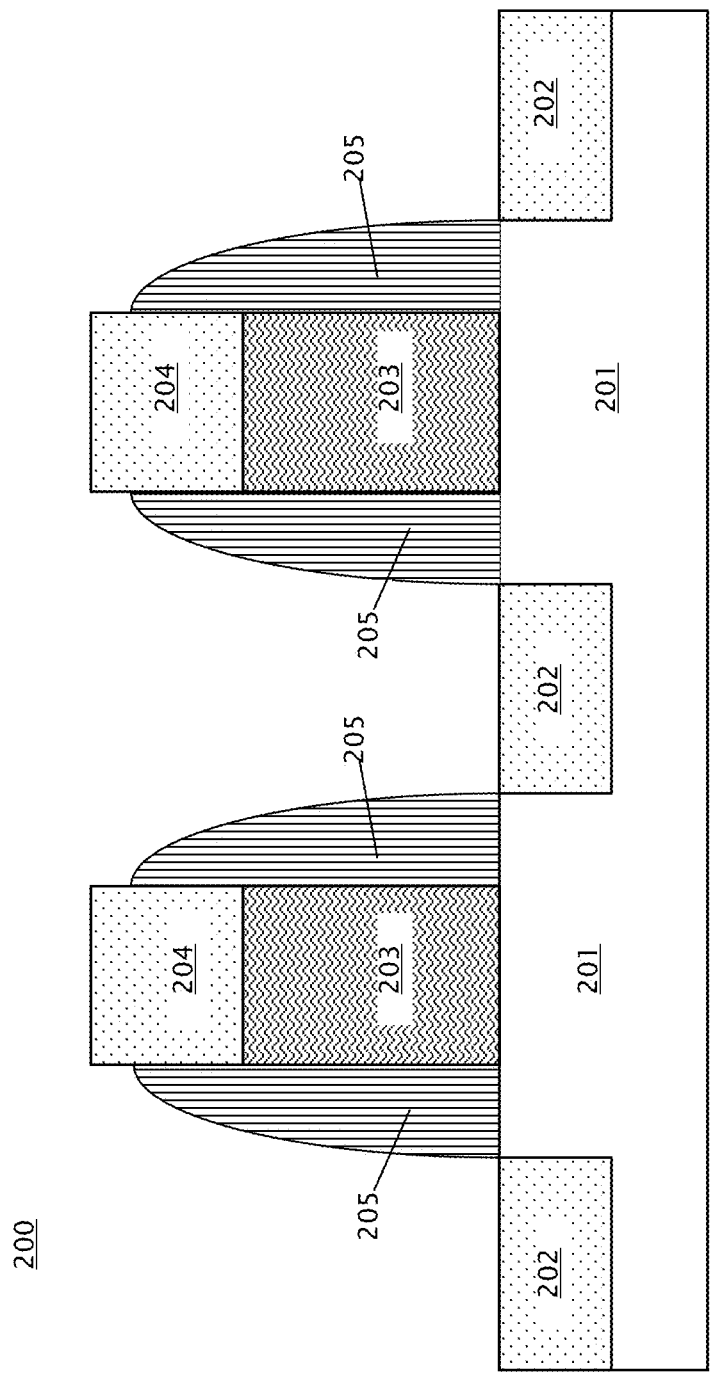
FIG. 2 is a cross sectional view illustrating an embodiment of a device with silicide in the gate and source/drain regions.

FIG. 1 is discussed with respect to FIGS. 2-5. In block 101 of FIG. 1, one or more silicide contact regions are formed on a device. FIG. 2 shows an example of a device 200 including silicide contact regions. Gate silicide contact regions 204 are located on top of device gate stacks 203. Spacers 205 are located adjacent to device gate stacks 203. Source/drain silicide contact regions 202 are located in substrate 201 on either side of spacers 205. Substrate 201 may include a silicon (Si) or a silicon germanium (SiGe) substrate in various embodiments, and the source/drain silicide contact regions 202 may be formed by depositing a metal (for example, nickel or nickel platinum) on substrate 201, annealing the substrate 201 and deposited metal to cause the deposited metal to react with the substrate to form the source/drain silicide contact regions 202, and removing any unreacted deposited metal. Gate silicide contact regions 204 may be formed simultaneously with source/drain silicide contact regions 202 by depositing the metal (for example, nickel or nickel platinum) on a silicon layer located on top of gate stack 203, annealing, and removing any unreacted metal. Gate stack 203 may include any appropriate gate stack material layers, and may include a high-k dielectric layer and/or a metal gate in various embodiments. The gate silicide contact regions 204 and source/drain silicide contact regions 202 may be from about 10 nanometers (nm) to about 30 nm thick in some embodiments, or up to about 50 nm after the contact region is fully silicided in other embodiments.

Returning to FIG. 1, in block 102, shallow impurity regions are formed in the top surface of the silicide contact regions that were formed in block 101. The impurities may be one or more of carbon (C) atoms, fluorine (F) and nitrogen (N) atoms in some embodiments. Additionally, in some embodiments, the impurities may be one or more of tantalum (Ta), rhenium (Re), molybdenum (Mo), titanium (Ti), niobium (Nb), arsenic (As) or antimony (Sb), and aluminum (Al). The shallow impurity regions may have an impurity concentration of at least about 1E15 per cm$^2$. The shallow impurity regions may extend from the top surface of the silicide to a depth of about 5 nanometers to about 10 nanometers into the silicide in some embodiments, or up to about 20 nm in other embodiments. The shallow impurity regions may be formed in the top surface of the silicide contact regions by implantation, cluster implantation, or by a plasma treatment in various embodiments.

Figure 3A:
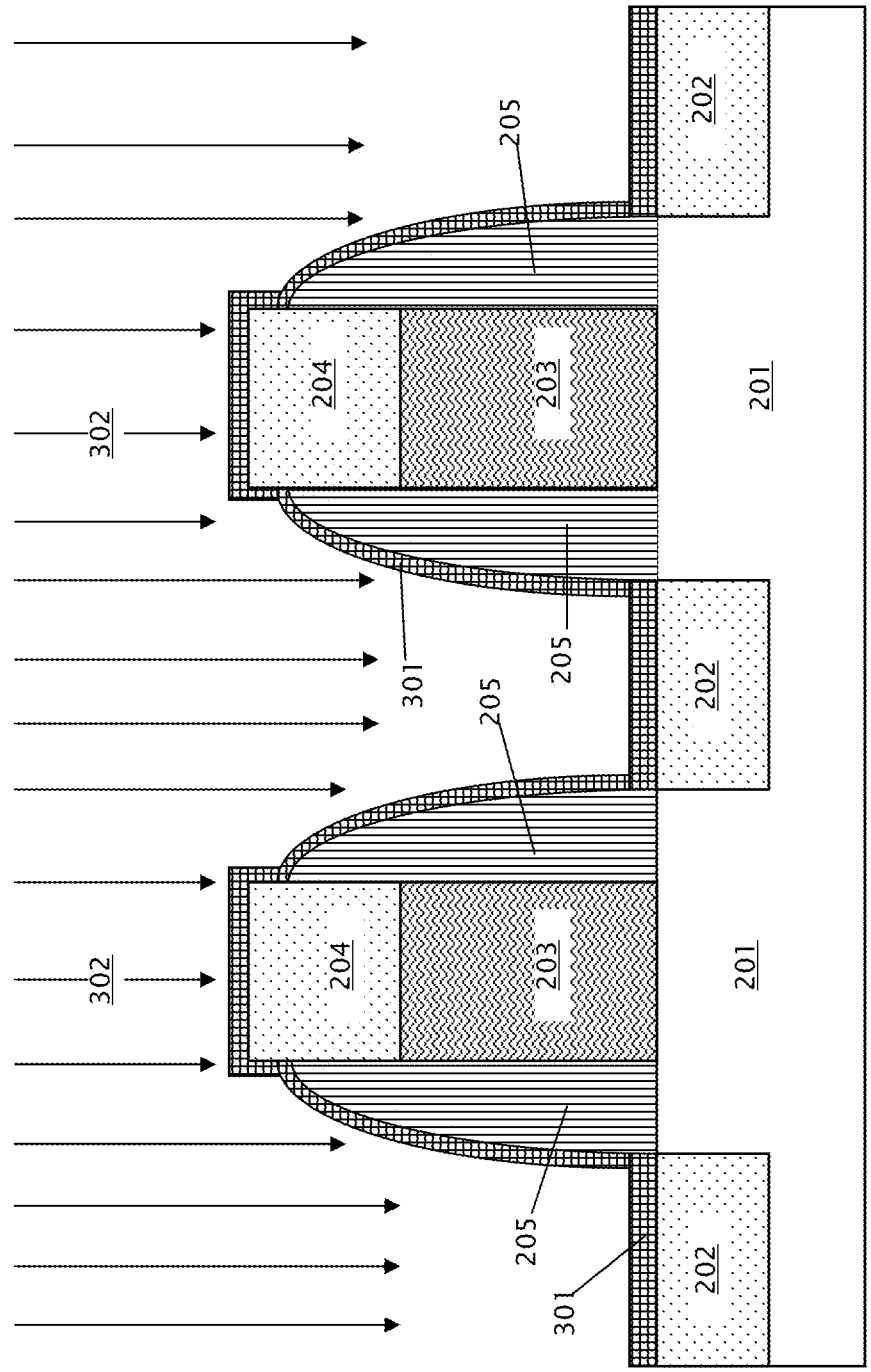
FIGS. 3A-B are cross sectional views illustrating embodiments of the device of FIG. 2 during implantation.
Figure 3B:
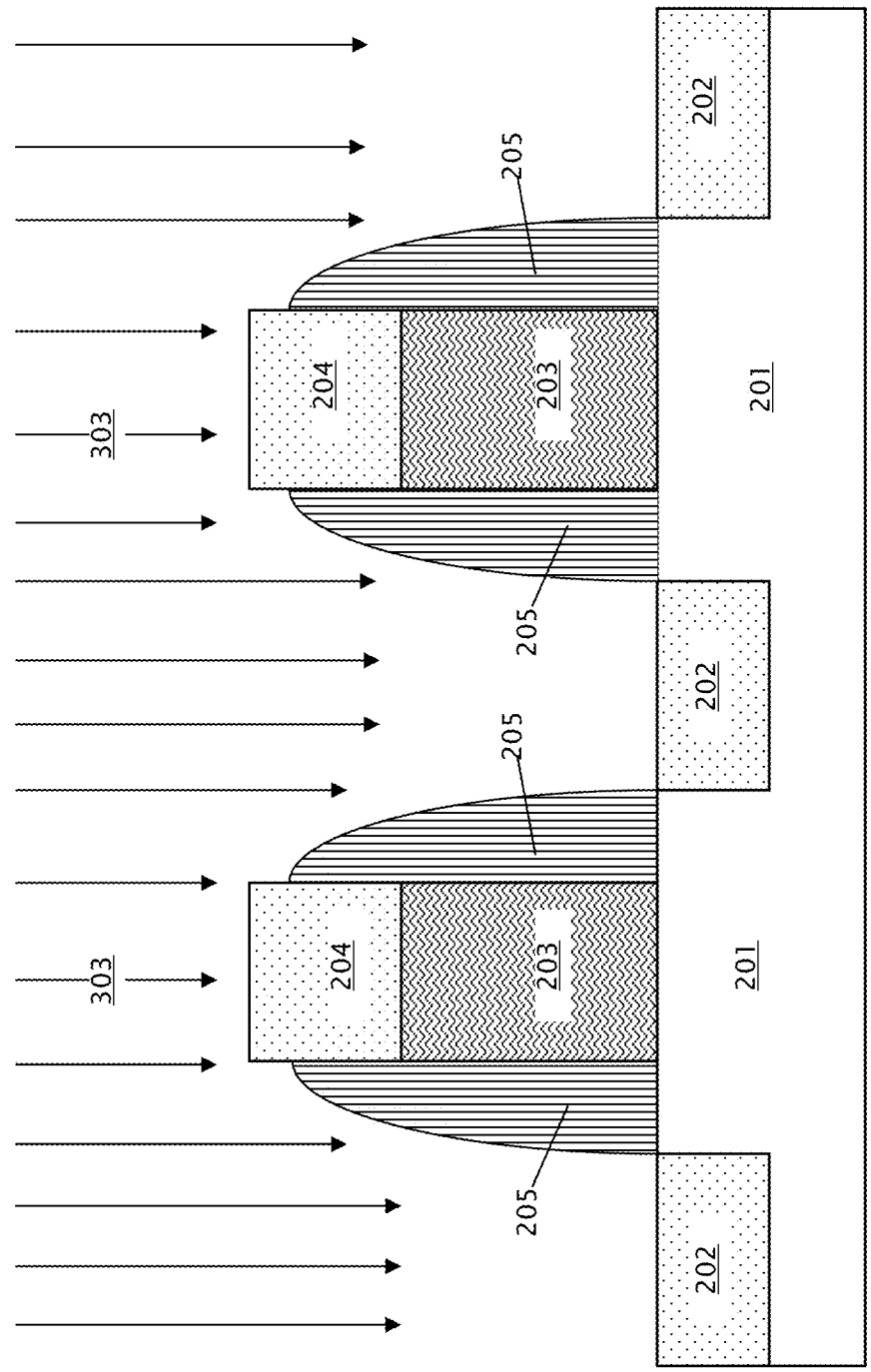

In embodiments in which implantation is used to form the shallow impurity regions, the device may first be protected by deposition of a thin screen layer of oxide over the device in some embodiments, as shown in FIG. 3A. The screen layer 301 prevents the impurity atoms from going too deep in the device, thereby preventing damage to the device. The deposition of the screen layer 301 may be conformal deposition, and the screen layer 301 may be about 30 angstroms thick in some embodiments. The screen layer 301 may be an oxide such as silicon oxide. After formation of the screen layer 301 over the device, the device may be implanted with the impurity atoms, e.g., C, F, or N, as indicated by arrows 302. The impurity atoms travel through the screen layer 301 and into the silicide contact regions 202/204. In other embodiments, the screen layer may be omitted, as is shown in FIG. 3B, and the gate silicide contact regions 204 and the source/drain silicide contact regions 202 are subjected to implantation 303 with the impurity. Implantation 303 of FIG. 3 may include one of C, F, and N in some embodiments. In further embodiments in which the shallow impurity regions are formed by cluster implantation or a plasma treatment, the screen layer is also omitted. The cluster implantation or plasma treatment may include application of one of methane (CH$_4$), silane (SiH$_4$), nitrogen triflouride (NF$_3$), and nitrogen gas (N$_2$) to the device 200 of FIG. 2.

Figure 4:
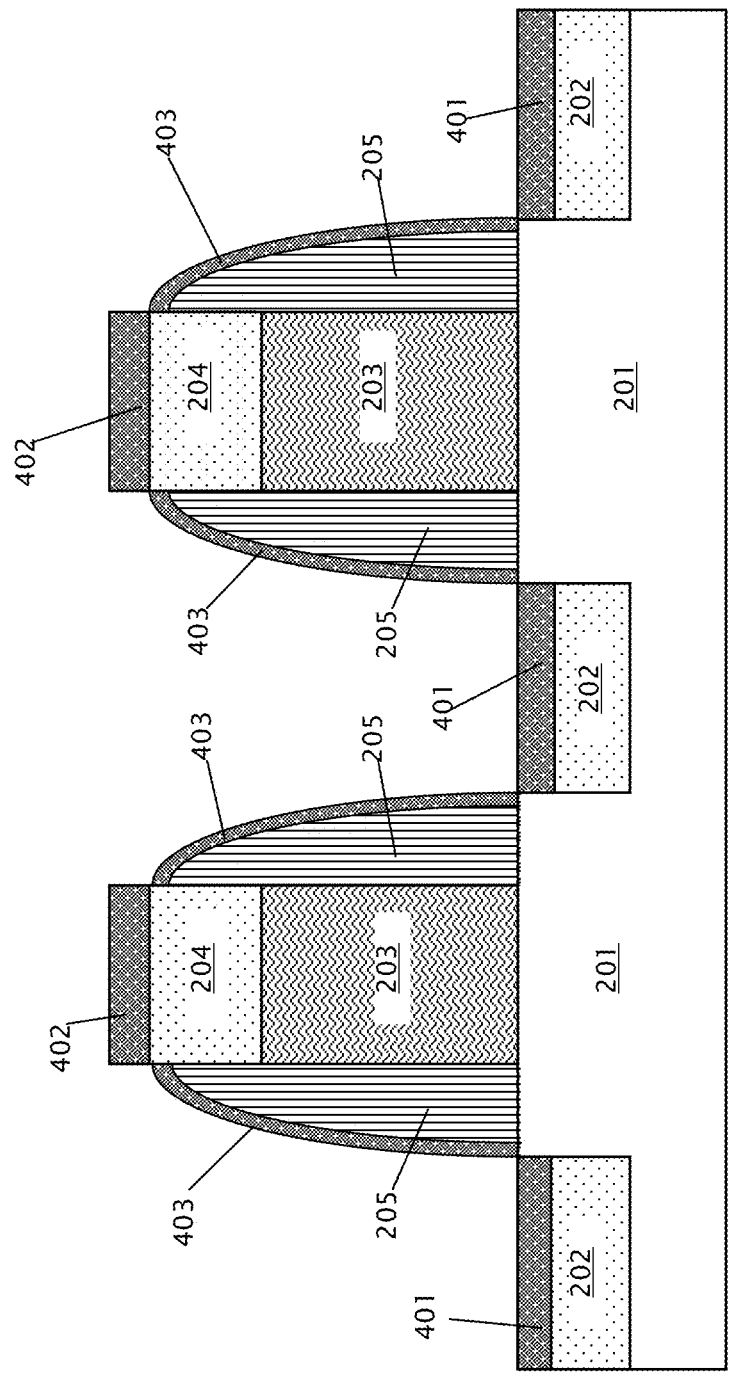
FIG. 4 is a cross sectional view illustrating an embodiment of the device of FIG. 2 after formation of shallow impurity regions in the gate and source/drain silicide.

FIG. 4 shows an embodiment of a device with source/drain shallow impurity regions 401 in the top surface of source/drain silicide contact regions 202, and gate shallow impurity regions 402 in the top surface of gate silicide contact regions 204. As discussed above, the source/drain shallow impurity regions 401 and gate shallow impurity regions 402 as shown in FIG. 4 may be formed by any of implantation, cluster implantation, or plasma treatment. The source/drain shallow impurity regions 401 and gate shallow impurity regions 402 may extend to a depth from about 5 nm to about 10 nm into the source/drain silicide contact regions 202 and gate silicide contact regions 204 in some embodiments. In other embodiments, the source/drain shallow impurity regions 401 and gate shallow impurity regions 402 may extend to a depth of up to about 20 nm into the source/drain silicide contact regions 202 and gate silicide contact regions 204. The source/drain shallow impurity regions 401 and gate shallow impurity regions 402 each have an impurity concentration (e.g., of C, F, or N) of at least 1E15 per cm$^2$. Spacers 205 may also be implanted with the impurities, forming spacer impurity regions 403 on spacers 205 in some embodiments.

Figure 5:
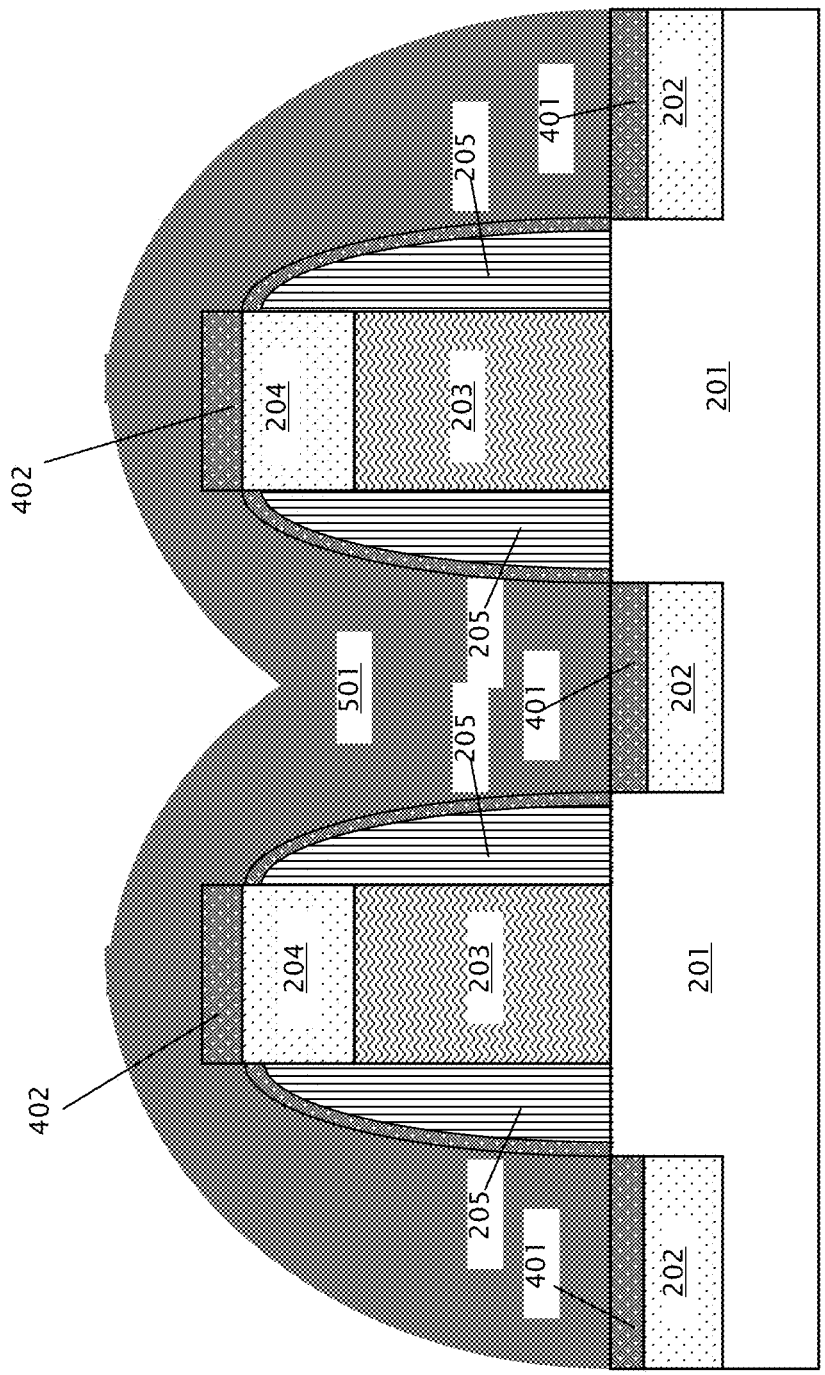
FIG. 5 is a cross sectional view illustrating an embodiment of the device of FIG. 2 after formation of a stressed liner over the device.

Returning again to FIG. 1, in block 103, a stressed liner is deposited over the device. As is shown in FIG. 5, the source/drain shallow impurity regions 401 and gate shallow impurity regions 402 are located at the interface between the stressed liner 501 and the silicide contact regions 202/204. The presence of the impurities in the source/drain shallow impurity regions 401 and gate shallow impurity regions 402 at the interface between the silicide contact regions 202/204 and the stressed liner 501 hinder diffusion of silicon, and, in some embodiments, germanium, within the silicide (which may be nickel or nickel platinum silicide) contact regions 202/204, preventing silicide degradation that may occur during the deposition of stressed liner 501. Stressed liner 501 may be a nitride such as silicon nitride (Si$_3$N$_4$). The stressed liner 501 may have a compressive stress in embodiments in which the silicided device over which the stressed liner 501 is formed is a PFET, and may have a tensile stress in embodiments in which the silicided device over which the stressed liner 501 is formed is a NFET.

While the method 100 of FIG. 1 is discussed with reference to a device having gate and source/drain silicide contacts, shallow impurity regions formed by method 100 may be formed in a top surface of any silicide contact on any device that is subsequently covered with a stressed nitride liner. For example, the device may only have silicide in the source/drain regions in some embodiments, or may only have silicide in the gate region in other embodiments.

The technical effects and benefits of exemplary embodiments include prevention of silicide contact degradation during formation of a stressed liner over a silicided CMOS device.

The terminology used herein is for the purpose of describing particular embodiments only and is not intended to be limiting of the invention. As used herein, the singular forms "a", "an", and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

The invention claimed is:

1. A method of forming a semiconductor device, the method comprising:
    forming a silicide contact region of a field effect transistor (FET);
    forming a shallow impurity region in a top surface of the silicide contact region, wherein at least one of the impurities in said shallow impurity region is one of carbon (C), nitrogen (N), and fluorine (F); and
    forming a stressed liner over the FET such that the shallow impurity region is located at an interface between the silicide contact region and the stressed liner, wherein the shallow impurity region comprises one or more impurities, and is configured to hinder diffusion of silicon within the silicide contact region and prevent morphological degradation of the silicide contact region.

2. A field effect transistor (FET), comprising:
    a gate structure formed over a substrate;
    source and drain regions formed in the substrate, adjacent the gate structure
    silicide contact regions formed on the gate structure, source and drain regions, the silicide contacts having a shallow impurity region located at a top surface thereof; and
    a stressed liner formed over the FET,
    wherein the shallow impurity region is located at an interface between the silicide contact region and the stressed liner, and wherein the shallow impurity region comprises one or more impurities, is configured to hinder diffusion of silicon within the silicide contact region and prevent morphological degradation of the silicide contact region, and wherein at least one of the impurities in said shallow impurity region is one of carbon (C), nitrogen (N), and fluorine (F).

3. A method of forming a semiconductor device, the method comprising:
    forming a silicide contact region of a field effect transistor (FET);
    forming a shallow impurity region in a top surface of the silicide contact region wherein at least one of the impurities in said shallow impurity region is one of tantalum (Ta), rhenium (Re), molybdenum (Mo), titanium (Ti), niobium (Nb), arsenic (As) or antimony (Sb), and aluminum (Al); and
    forming a stressed liner over the FET such that the shallow impurity region is located at an interface between the silicide contact region and the stressed liner, wherein the shallow impurity region comprises one or more impurities, and is configured to hinder diffusion of silicon within the silicide contact region and prevent morphological degradation of the silicide contact region.

4. A method of forming a semiconductor device, the method comprising:
    forming a silicide contact region of a field effect transistor (FET);
    forming a shallow impurity region in a top surface of the silicide contact region wherein the shallow impurity region has an impurity concentration of about 1E15 per $cm^2$ or greater; and
    forming a stressed liner over the FET such that the shallow impurity region is located at an interface between the silicide contact region and the stressed liner, wherein the shallow impurity region comprises one or more impurities, and is configured to hinder diffusion of silicon within the silicide contact region and prevent morphological degradation of the silicide contact region.

5. A method of forming a semiconductor device, the method comprising:
    forming a silicide contact region of a field effect transistor (FET);
    forming a shallow impurity region in a top surface of the silicide contact region wherein the shallow impurity region has a depth into the silicide contact region from about 5 nanometers to about 10 nanometers from the top surface of the silicide contact region; and
    forming a stressed liner over the FET such that the shallow impurity region is located at an interface between the silicide contact region and the stressed liner, wherein the shallow impurity region comprises one or more impurities, and is configured to hinder diffusion of silicon within the silicide contact region and prevent morphological degradation of the silicide contact region.

6. A method of forming a semiconductor device, the method comprising:
    forming a silicide contact region of a field effect transistor (FET);
    forming a shallow impurity region in a top surface of the silicide contact region wherein the shallow impurity region is formed by implantation of the silicide contact region with one or more of carbon, fluorine, and nitrogen; and
    forming a stressed liner over the FET such that the shallow impurity region is located at an interface between the silicide contact region and the stressed liner, wherein the shallow impurity region comprises one or more impurities, and is configured to hinder diffusion of silicon within the silicide contact region and prevent morphological degradation of the silicide contact region.

7. The method of claim 6, further comprising forming a screen layer over the FET before implantation of the silicide contact region.

8. A method of forming a semiconductor device, the method comprising:
    forming a silicide contact region of a field effect transistor (FET);
    forming a shallow impurity region in a top surface of the silicide contact region; and
    forming a stressed liner over the FET such that the shallow impurity region is located at an interface between the silicide contact region and the stressed liner, wherein the shallow impurity region comprises one or more impurities, and is configured to hinder diffusion of silicon within the silicide contact region and prevent morphological degradation of the silicide contact region, and wherein the shallow impurity region is further configured to hinder diffusion of germanium within the silicide contact region.

9. A method of forming a semiconductor device, the method comprising:
- forming a silicide contact region of a field effect transistor (FET);
- forming a shallow impurity region in a top surface of the silicide contact region wherein the shallow impurity region is formed by plasma treatment of the silicide contact region with at least one of methane ($CH_4$), silane ($SiH_4$), nitrogen triflouride ($NF_3$), and nitrogen gas ($N_2$); and
- forming a stressed liner over the FET such that the shallow impurity region is located at an interface between the silicide contact region and the stressed liner, wherein the shallow impurity region comprises one or more impurities, and is configured to hinder diffusion of silicon within the silicide contact region and prevent morphological degradation of the silicide contact region.

10. A method of forming a semiconductor device, the method comprising:
- forming a silicide contact region of a field effect transistor (FET);
- forming a shallow impurity region in a top surface of the silicide contact region wherein the shallow impurity region is formed by cluster implantation of the silicide contact region with at least one of methane ($CH_4$), silane ($SiH_4$), nitrogen triflouride ($NF_3$), and nitrogen gas ($N_2$); and
- forming a stressed liner over the FET such that the shallow impurity region is located at an interface between the silicide contact region and the stressed liner, wherein the shallow impurity region comprises one or more impurities, and is configured to hinder diffusion of silicon within the silicide contact region and prevent morphological degradation of the silicide contact region.

11. A field effect transistor (FET), comprising:
a gate structure formed over a substrate;
source and drain regions formed in the substrate, adjacent the gate structure
silicide contact regions formed on the gate structure, source and drain regions, the silicide contacts having a shallow impurity region located at a top surface thereof; and
a stressed liner formed over the FET,
wherein the shallow impurity region is located at an interface between the silicide contact region and the stressed liner, and wherein the shallow impurity region comprises one or more impurities, is configured to hinder diffusion of silicon within the silicide contact region and prevent morphological degradation of the silicide contact region, and wherein at least one of the impurities in said shallow impurity region is one of tantalum (Ta), rhenium (Re), molybdenum (Mo), titanium (Ti), niobium (Nb), arsenic (As) or antimony (Sb), and aluminum (Al).

12. A field effect transistor (FET), comprising:
a gate structure formed over a substrate;
source and drain regions formed in the substrate, adjacent the gate structure
silicide contact regions formed on the gate structure, source and drain regions, the silicide contacts having a shallow impurity region located at a top surface thereof; and
a stressed liner formed over the FET,
wherein the shallow impurity region is located at an interface between the silicide contact region and the stressed liner, and wherein the shallow impurity region comprises one or more impurities, is configured to hinder diffusion of silicon within the silicide contact region and prevent morphological degradation of the silicide contact region, and wherein the shallow impurity region has an impurity concentration of about 1E15 per $cm^2$ or greater.

13. A field effect transistor (FET), comprising:
a gate structure formed over a substrate;
source and drain regions formed in the substrate, adjacent the gate structure
silicide contact regions formed on the gate structure, source and drain regions, the silicide contacts having a shallow impurity region located at a top surface thereof; and
a stressed liner formed over the FET,
wherein the shallow impurity region is located at an interface between the silicide contact region and the stressed liner, and wherein the shallow impurity region comprises one or more impurities, is configured to hinder diffusion of silicon within the silicide contact region and prevent morphological degradation of the silicide contact region, and wherein the shallow impurity region has a depth in the silicide contact region from about 5 nanometers to about 10 nanometers from the top surface of the silicide contact region.

14. A field effect transistor (FET), comprising:
a gate structure formed over a substrate;
source and drain regions formed in the substrate, adjacent the gate structure
silicide contact regions formed on the gate structure, source and drain regions, the silicide contacts having a shallow impurity region located at a top surface thereof; and
a stressed liner formed over the FET,
wherein the shallow impurity region is located at an interface between the silicide contact region and the stressed liner, and wherein the shallow impurity region comprises one or more impurities, is configured to hinder diffusion of silicon within the silicide contact region and prevent morphological degradation of the silicide contact region; and
further comprising a screen layer located over the FET between the shallow impurity region and the stressed liner.

* * * * *